United States Patent [19]
Consiglio et al.

[11] Patent Number: 5,734,287
[45] Date of Patent: Mar. 31, 1998

[54] CONTROL OF DISTORTION IN A LINE-POWERED AMPLIFIER WITH A RAIL-TO-RAIL OUTPUT VOLTAGE SWING

[75] Inventors: Pietro Consiglio, Milan; Carlo Antonini, Inferiore, both of Italy

[73] Assignee: SGS-Thomson Microelectronics, S.r.l., Agrate Brianza, Italy

[21] Appl. No.: 545,165

[22] Filed: Oct. 19, 1995

Related U.S. Application Data

[63] Continuation of Ser. No. 339,122, Nov. 10, 1994, abandoned.

[30] Foreign Application Priority Data

Nov. 12, 1993 [IT] Italy ............... VA/93/A/0027

[51] Int. Cl.$^6$ ................................................ H03K 5/08
[52] U.S. Cl. ................ 327/317; 327/112; 327/308; 327/312; 327/560; 330/265; 330/271; 330/278; 330/279
[58] Field of Search ....................... 327/560, 561, 327/562, 563, 108, 112, 133, 109, 110, 111, 308, 478, 482, 484, 309, 312, 315–319, 323, 327, 329; 330/262, 263, 264, 265, 269, 278

[56] References Cited

U.S. PATENT DOCUMENTS

| | | | |
|---|---|---|---|
| 4,509,020 | 4/1985 | van de Plassche et al. | 330/274 |
| 4,812,779 | 3/1989 | Wagner | 330/149 |
| 5,229,721 | 7/1993 | Stade | 330/265 |

FOREIGN PATENT DOCUMENTS

| | | |
|---|---|---|
| 0 295 497 A2 | 12/1988 | European Pat. Off. . |
| 0 295 497 A3 | 12/1988 | European Pat. Off. . |
| 408137A1 | 1/1991 | European Pat. Off. . |
| 0 587 966 A1 | 3/1994 | European Pat. Off. . |

OTHER PUBLICATIONS

Patent Abstracts of Japan, vol. 10, No. 248 (E–432), 26 Aug. 1986 & JP–A–61 077 406 (Sanyo Electric Co. Ltd.), 21 Apr. 1986.

*Primary Examiner*—Timothy P. Callahan
*Assistant Examiner*—Kenneth B. Wells
*Attorney, Agent, or Firm*—Robert Groover; Betty Formby; Matthew Anderson

[57] ABSTRACT

Distortion control in a push-pull output stage of a speech amplifier of a telephone powered through the telephone line is more effectively and advantageously implemented by independently sensing an eventual state of saturation reached by any of the two output transistors of the amplifier, summing the current signals representative of the sensed state of saturation of either or both output transistors, integrating the resulting sum current signal to produce a DC signal and using the DC signal for activating an AGC loop. The DC signal indiscriminately accounts for any cause of saturation, though virtually representing the level of the amplified AC signal. Distortion may be controlled without penalizing output voltage swing and power consumption.

15 Claims, 3 Drawing Sheets

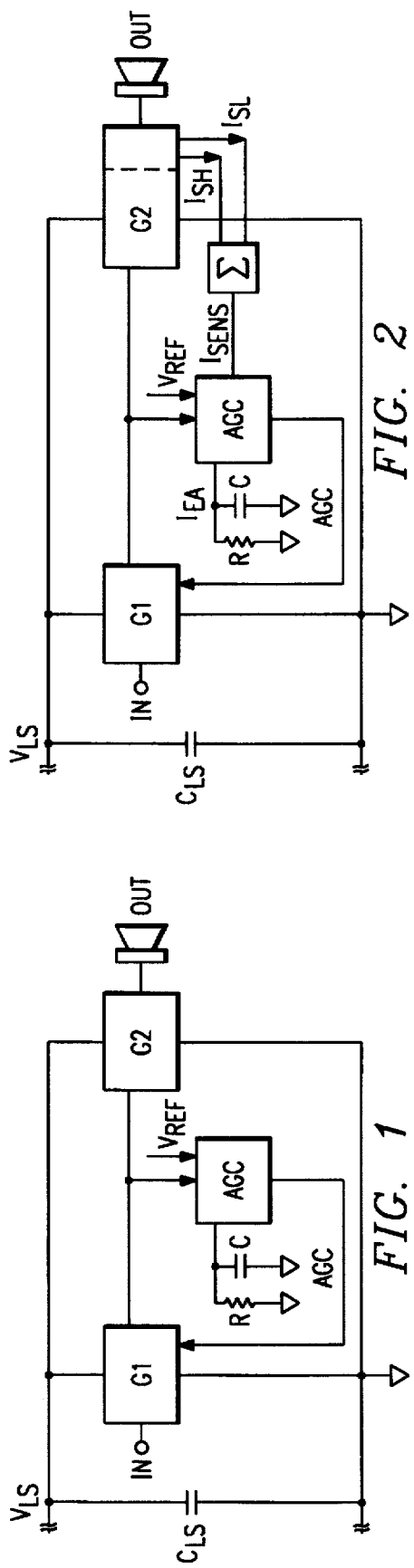
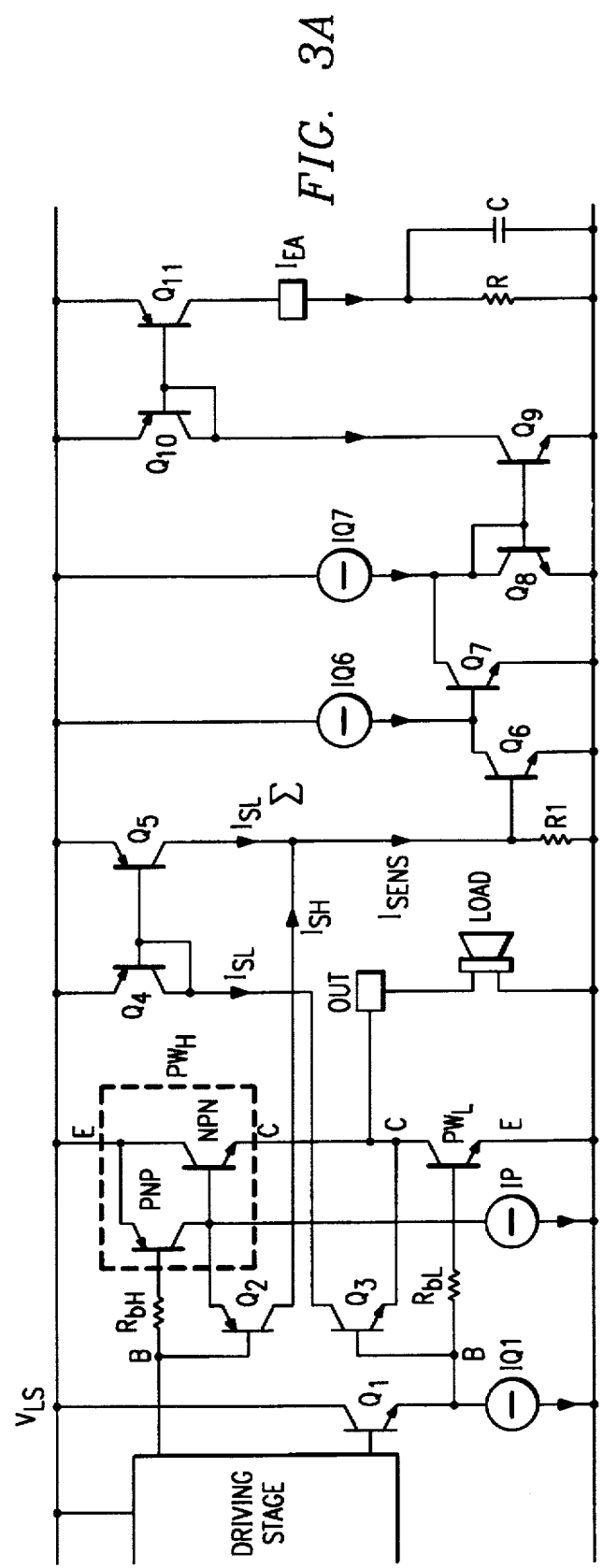
FIG. 1
FIG. 2
FIG. 3A

CONTROL OF DISTORTION IN A LINE-POWERED AMPLIFIER WITH A RAIL-TO-RAIL OUTPUT VOLTAGE SWING

This application is a continuation of application Ser. No. 08/339,122, filed Nov. 10, 1994 and now abandoned.

CROSS-REFERENCE TO RELATED APPLICATION

This application claims priority from Italian app'n VA/93/A/0027, filed Nov. 12, 1993, which is hereby incorporated reference.

BACKGROUND AND SUMMARY OF THE INVENTION

The present invention relates to an automatic distortion control system for an amplifier, the effectiveness of which is substantially independent from variations of the supply voltage, from the load level and from the process spread, while not requiring any substantial reduction of the output dynamic characteristics of the amplifier. The system of the invention is particularly though not exclusively useful in speech circuits of telephones powered through the telephone line.

In many known applications such as in line-powered telephones containing an amplifier that drives a loudspeaker, automatic control of distortion is required, which is commonly implemented by an automatic gain control system (AGC). The ability to deliver the maximum power to the load, compatible with the supply voltage and current, is an important attendant requirement of a power amplifier.

In telepowered systems, as for example in common telephones, the functional circuits of the apparatus are powered directly by the telephone (signal carrying) line when the handset is lifted from its cradle, thus closing a supply switch. In this activated condition, a current may therefore flow through the speech circuits of the apparatus. In terms of continuous current (DC), the speech circuit of a telephone may, in a first approximation, be considered similar to a resistance connected in series with a battery. On the other hand, a telephone line may be considered as a series of RC networks, the number of RC cells being a function of the length of the telephone line. As a consequence, the DC current that flows through a remote telephone is a function of the local substation's battery, of the electrical characteristics of the telephone line as well as of the speech circuit that is powered through the line. This in turn determines a certain supply voltage across the speech circuit of the apparatus.

Commonly, the DC current that is absorbed from the telephone line is divided by a dedicated current divider circuit in a priority mode in order to ensure as far as possible correct operation and functionality of the telephone as a whole. In more sophisticated telephones, a part of the current drawn from the telephone line may be used for powering an amplifier that drives a loudspeaker, for implementing so-called "monitor" and "amplified listening" functions.

The "monitor" function (monitoring of the state of the line) becomes operative when the user, without unhooking the handset but by pressing a button, closes an activation switch of the telephone and thereafter dials the required telephone number. In these conditions, the amplifier is powered and through the loudspeaker embodied in the telephone, it is possible to acoustically recognize the state of the line.

The "amplified" listening function becomes operative when, having already established a connection by lifting the handset from its cradle, it is desired to let bystanders listen to the dialogue taking place between the two telephone users.

Of course, along the telephone line, the telephone communication (audio) signals TX and RX are exchanged, superimposed on the DC current.

It is evident that in telepowered systems it is particularly important to minimize power consumption while ensuring the maximum possible dynamic swing of the undistorted amplified signal.

In order to optimize the dynamic output characteristics of a telepowered amplifier, an output power stage may be used which is composed of a complementary pair of bipolar transistors PNP/NPN, functioning in phase opposition. The pull-up element of the output stage, that is the PNP transistor, notably requires a relatively large area of integration because of its intrinsic low current density of operation. For this reason, the PNP transistor is often replaced, in integrated circuits, by a composite PNP+NPN structure, which can be virtually considered as a PNP transistor. In this case, the output voltage swing is reduced by about a VBE (base emitter voltage), a consequence that is often accepted as a viable compromise.

The systems for dividing the total current that can be absorbed from the telephone line implement a priority system which allocates current according to functional requirements.

In most systems for dividing the supply current drawn from the telephone line, the supply voltage of a particular functional circuit (e.g., an audio amplifier that drives a loudspeaker) is established by a shunt regulator to a certain value that is correlated to the DC voltage on the telephone line. The regulated supply voltage is developed across a supply tank capacitor. A system of this type is described in the article: "A single chip BIMOS telephone set" by C. Nguyen et al., 1989 ISSCC DIGEST 254. A particularly suitable circuit for splitting a supply current is described in the European Patent Application 92830498.9, filed on Sep. 28, 1992 by the same applicant.

In these telepowered systems, it may occur that in presence of a particularly strong AC signal at the input of the amplifier, the total electrical load (loudspeaker +amplifier) requires a higher current than the fraction of line current that is eventually diverted to the shunt regulator that charges the supply tank capacitor of the amplifier-loudspeaker block. As a consequence, the voltage across the tank capacitor will drop and, for the same gain of the amplifier, a strongly distorted output signal may be produced because of the saturation of one and/or the other transistor of the push-pull output stage of the amplifier, in coincidence with positive and/or negative peaks of the AC signal.

Another eventuality is that the transistors of the output stage may saturate (in correspondence with the AC signal peaks) when the voltage across the supply tank capacitor of the amplifier is insufficient for allowing the correct output dynamics (for a given gain of the amplifier and amplitude of the input AC signal), even though the total current absorbed by the amplifier and its load remain lower than the current delivered to the amplifier by the current splitting system of the DC current drawn from the line.

In order to control the distortion caused by the saturation of the output stage transistors, an automatic gain control system (AGC) of the amplifier is normally employed.

FIG. 1 shows a block diagram of an amplifier provided with an automatic gain control (AGC) according to a known technique.

The amplifier shown is essentially constituted by a gain block G1 and by an output power block G2. The automatic gain control, suitable to prevent saturation of the transistors of a push-pull power stage of the G2 block, is implemented by detecting the AC signal at the output of the pre-amplifier G1, comparing the DC voltage developed across an integrating RC network with a reference voltage $V_{REF}$ and generating a AGC difference signal which is used for modifying the gain of the pre-amplifier G1.

The system is capable of preventing saturation of the transistors of the output stage of G2. On the other hand, such a system essentially acts on the AC signal level and is unable to consider other parameters such as variation of the gain of the output block G2, offset voltage, the load level, which in a telepowered system, as mentioned above, may have a direct influence on the supply voltage $V_{LS}$, as well as the so-called fabrication spread, temperature of operation, etc. In practice, the reference voltage $V_{REF}$ must be fixed in the design phase, by taking into account a hypothetical concurrence of more factors that could limit the maximum output voltage swing and therefore it must necessarily be fixed conservatively at a value such as to exclude saturation of the output transistors also in one of the worst hypothesis of operating conditions of the amplifier. This inevitably limits the maximum output voltage swing that could be practicable otherwise.

There is the need or utility for an automatic distortion control system that will not necessarily require a preventive limitation of the dynamic characteristics of a telepowered amplifier.

This objective is fully met by the automatic gain control system of the present invention.

Basically the system of the invention consists in independently detecting an eventual state of saturation of any one of the two transistors of a push-pull pair of the output stage of the amplifier and generating a current representative of the state of saturation reached by a respective transistor. The currents thus independently generated are summed and the resultant sum current, suitably processed, is used for charging an integrating RC network. Across the integrating network a DC signal develops, that is virtually representative of the level of the AC signal amplified by the amplifier, whenever one or the other of the output transistors enters saturation. Therefore, a gain regulation loop for reducing the gain of a pre-amplifier section of the amplifier is activated only upon the occurrence of saturation conditions of one or the other or both output transistors of the power stage, irrespectively of the cause that has determined saturation thereof.

The advantages that are achieved with the novel system of the invention are evident. Eminently, the output dynamic characteristics of the amplifier are maximized under any phase of operation, with a direct positive effect on power consumption. In practice, all variables that may directly or indirectly cause distortion are effectively counter-balanced upon the occurrence of a still negligible distorting effect by the particular automatic gain control system object of the present invention.

BRIEF DESCRIPTION OF THE DRAWING

The different aspects and advantages of the invention will become more evident through the following description of several important embodiments and by referring to the annexed drawings, wherein:

FIG. 1 is a functional block diagram of an amplifier provided with an AGC system, according to a known technique as described above;

FIG. 2 is a functional block diagram of an automatic gain control system of an amplifier according to the present invention;

FIGS. 3A and 3B are diagrams of a circuit for the automatic control of distortion according to the present invention.

DETAILED DESCRIPTION OF THE PREFERRED EMBODIMENTS

The numerous innovative teachings of the present application will be described with particular reference to the presently preferred embodiment (by way of example, and not of limitation), in which:

With reference to the block diagram of FIG. 2, an amplifier is composed of a gain stage G1 and an output stage G2. The inventive system for controlling distortion in the amplifier is based on detecting saturation of the transistors of the amplifier's push-pull output power stage, and generating a current representative of an eventual state of saturation reached by either or both transistors.

The generated currents $I_{SH}$ and $I_{SL}$ are summed in the block $\Sigma$ and the resulting sum current $I_{SENS}$ is fed to an automatic gain control block AGC. The current $I_{SENS}$, suitably processed, determines the charge through a current $I_{EA}$, which may be constant, of an integrating RC network. Across the integrating network a DC signal develops, used by the AGC block as a signal virtually representing the level of the AC signal amplified by the amplifier. In practice, the voltage across the integrating RC network is compared with a reference voltage $V_{REF}$, in order to produce a signal "difference" or AGC signal, which is used for modifying the gain of the gain stage G1.

In other words, the system of the invention intervenes whenever one or the other or both the transistors of the push-pull output power stage enters a stage of saturation thus determining, through an AGC control loop, a correlating reduction of the total gain of the amplifier, sufficient to re-establish linear operating conditions of the output transistors.

Of course, the time of response of the self-regulating loop may be extremely fast so as not to produce detectable (audible) effects. Response times, as well as other operating parameters may be regulated either by modifying the gain of the gain stages of the current $I_{SENS}$ and/or by modifying the time constant determined by the integrating RC network and/or by modifying the reference voltage $V_{REF}$ of the AGC regulating loop.

Figure 3B:
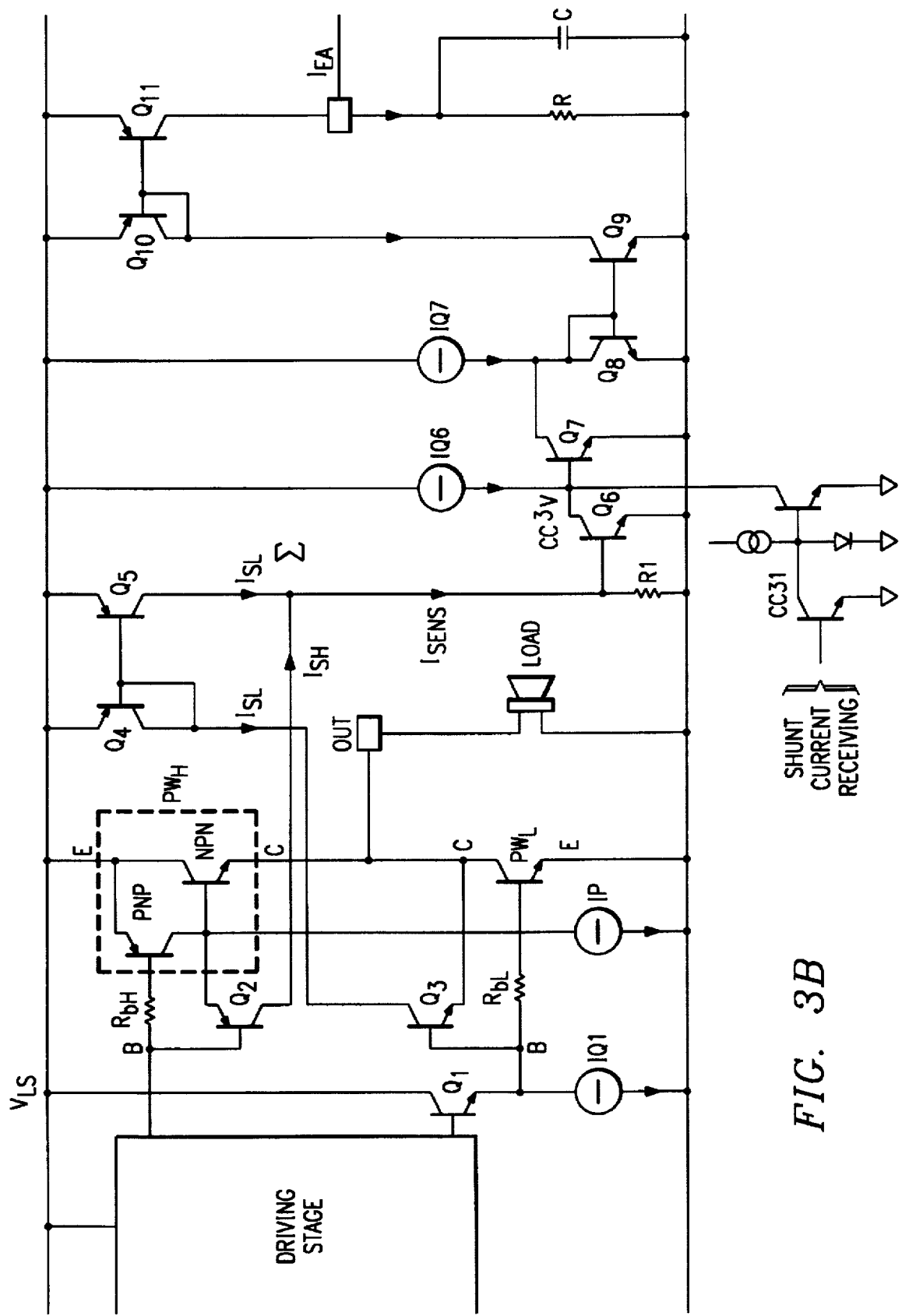

The circuit diagram of a typical amplifier output stage, suitable for driving a load that may be represented by a loudspeaker, is shown in FIGS. 3A and 3B. Commonly the output stage may comprise a driving stage capable of driving a pair of complementary power transistors $PW_H$ and $PW_L$, according to a common push-pull scheme.

In the given example, the upper or "pull-up" transistor $PW_H$ is in fact realized in integrated form as a composite structure that comprises a PNP transistor and an NPN transistor, as depicted in the Figure. Electrically, the composite structure behaves as an "equivalent PNP" transistor, the respective emitter (E), base (B) and collector (C) nodes of which are identified in the Figure. This integrated circuit solution, which sensibly reduces the integration area on silicon, implies the use of a bias current generator IP for the PNP of the composite structure, as well as of a driving stage for the power NPN, constituted by the transistor $Q_1$ and by the relative bias generator IQ1.

The diagram also shows base resistance, $R_{bH}$ and $R_{bL}$ that may be advantageously added in order to enhance the rising of the collector voltage above the base voltage for the PNP transistor of the equivalent composite structure of $PW_H$, and the fall of the collector voltage below the base voltage for the NPN transistor $PW_L$, upon the reaching by the relative transistor of a saturation condition.

The reaching of a saturation condition of a respective power transistor of the output push-pull stage of the amplifier is independently detected by the transistor $Q_3$ (for the transistor $PW_L$) and by the transistor $Q_2$ (for the equivalent transistor structure $PW_H$). Both detecting transistors $Q_2$ and $Q_3$ are in an OFF condition as long as the respective transistor of the complementary output pair remains in a linear operating condition; being kept in an off condition by reverse biasing their base-emitter junction.

When one of the power transistors enters saturation, the voltage difference between base and collector thereof inverts its sign, thus bringing to a conducting state the respective transistor ($Q_2$ or $Q_3$). The currents that are eventually generated by the saturation detecting transistors $Q_2$ and $Q_3$ are summed on the sum node d, by mirroring through $Q_4$ and $Q_5$ the current of $Q_3$ on the summation node d.

Therefore, the resulting sum current $I_{SENS}$ constitutes therefore an information on the saturation state eventually reached by either or both output transistors in coincidence with positive and/or negative peaks of an AC signal fed to the input of the amplifier. Such an information ($I_{SENS}$) may therefore be assumed to correspond to an information on the level of the AC signal and, as such, may be input to an automatic gain control block AGC. In practice, the signal $I_{SENS}$ enables, through the transistor $Q_6$ and $Q_7$, the propagation of the current IQ7 through the current mirrors $Q_8$–$Q_9$ and $Q_{10}$–$Q_{11}$, in order to produce a current $I_{EA}$ that can be used for charging an integrating RC network suitable to convert the current signal into a DC voltage signal (developed across the integrating RC network). Such a signal can be compared with a reference voltage $V_{REF}$ purposely input to the AGC block (see the functional block diagram of FIG. 2).

FIG. 3B shows the presence of information coming from a shunt regulator that fixes the $V_{LS}$ voltage. $I_{SENS}$ is an indicator that will be present every time the final stage tends to saturate causing a strong distortion of the signal (clamp) and therefore the circuit intervenes to reduce the output dynamic. Such a distortion could be present when the voltage across the buffer capacitor is insufficient to allow, for the same gain of the amplifier and amplitude of the input AC signal, a correct undistorted output dynamic.

Reduction of the output dynamic is also necessary when the current in the shunt regulator tends to reduce itself to zero due to the effect of the total load (a speaker plus amplifier). In this case, through the $I_{EA}$ pin an indication of "shunt current sensing" is provided and results in a reduction of the output dynamic, with a consequent reduced absorption from $V_{LS}$.

In a typical embodiment of the invention in a telephone set, such as depicted in FIGS. 3A and 3B, the local supply voltage $V_{LS}$ may vary between $2V_{MIN}$ up to a voltage compatible with the fabrication technology of the integrated circuit.

With normal fabrication technologies, the current absorption by the amplifier may be minimized to about 300 µA by using a class AB mode of operation of the output stage. The current through the load (loudspeaker) depends on the current availability from the telephone line, normally corresponding to about a maximum current absorption of 100 mA.

The maximum output voltage swing of the amplifier when a composite integrated structure PNP-NPN is used for implementing an equivalent PNP transistor $PW_H$ (FIG. 2), is given by $$V_{LS} - (1V_{BE} + 2V_{CESAT}).$$

Total distortion is lower than 1%.

The total distortion is independent of process spread, temperature, loading impedance, and intrinsic gain changes, as well as from a lowering of the supply voltage $V_{LS}$ and/or a reduced availability of DC current from the telephone line.

Figure 4:
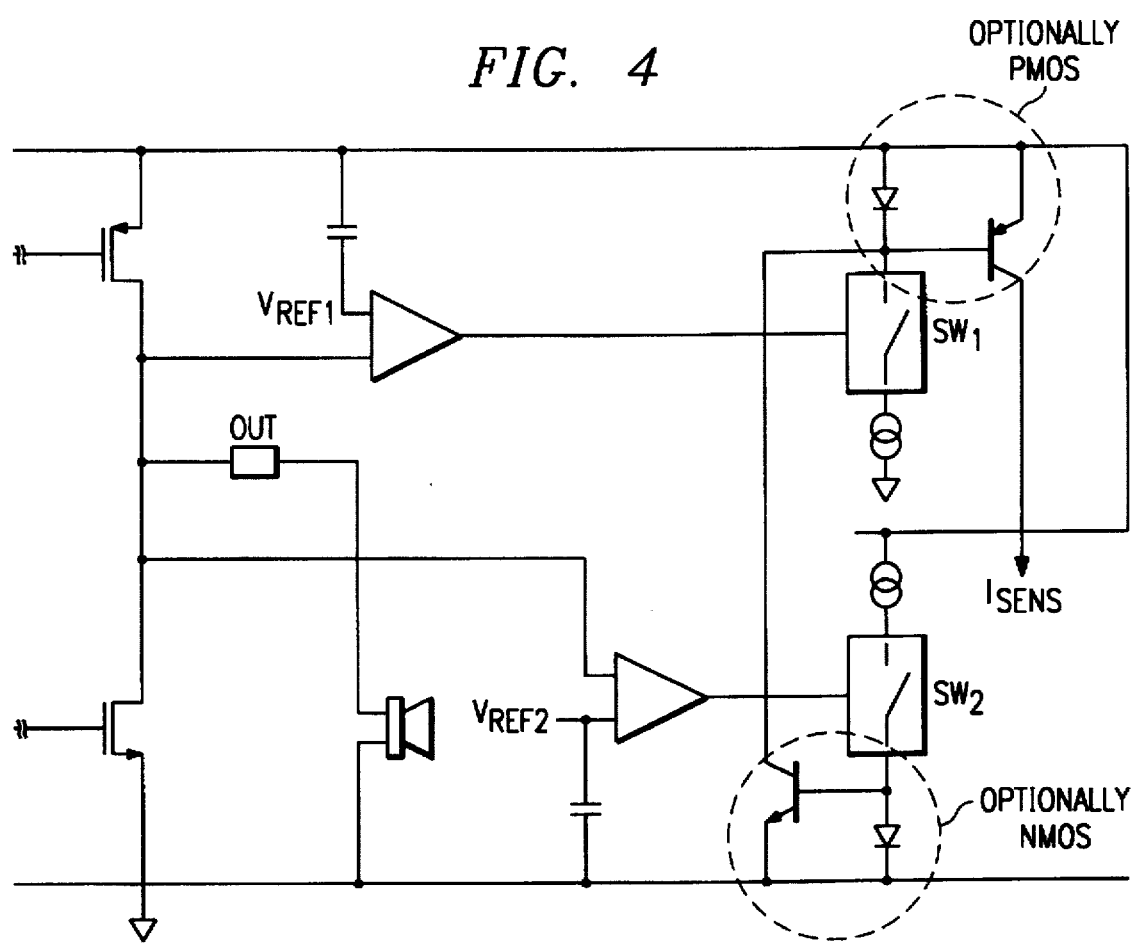
FIG. 4 is a circuit diagram for an adaptation of the circuit to MOS power output.

FIG. 4 discloses an alternative embodiment of the invention, utilizing a MOS power output stage. In this instance, the circuits for detecting the state of saturation are of course modified with comparator circuits which activate SW1/SW2 every time the V drain-source voltage of the power MOS drops below $V_{ref1}/V_{ref2}$. The activation of the switches SW1/SW2 permits the generation of $I_{SENS}$ which will then be processed as in the case of a bipolar implementation.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An amplifier circuit, comprising:
   a final amplifier stage which includes
   a connection for receiving an input signal,
   a pull-up transistor connected to drive an output node toward a more positive supply voltage, and
   a pull-down transistor connected to drive said output node toward a more negative supply voltage,
   said pull-up and pull-down transistors being controlled to operate in dependence on the level of the input signal;

a first saturation-detector circuit, connected to provide a first signal indicative of the degree of saturation of said pull-up transistor, and a second saturation-detector circuit, connected to provide a second signal indicative of the degree of saturation of said pull-down transistor;

a summing circuit connected to sum said first and second signals, and to provide a combined output accordingly; and an automatic gain control circuit connected to reduce the magnitude of said input signal when said combined signal increases;

an integrating RC network connected to receive and be chargeable by said sum current to develop a DC signal, virtually representative of the audio signal level;

whereby said automatic gain control circuit prevents said transistors from operating under conditions of high distortion.

2. The amplifier circuit of claim 1, wherein said pull-up transistor and said pull-down transistor are bipolar and respective resistors are operatively connected in series with the base terminal of both said pull-up transistor and said pull-down transistor.

3. The amplifier circuit of claim 1, wherein at least one of said pull-up transistor and pull-down transistor is constituted by a composite structure that comprises a pair of complementary transistors connected to virtually compose an equivalent transistor structure.

4. An amplifier circuit, comprising:
   at least one preliminary amplifier stage connected to amplify an analog signal, and
   a final amplifier stage, operatively connected to receive an output of said preliminary amplifier stage, and comprising
      a pull-up transistor connected to drive an output node toward a more positive supply voltage, and
      a pull-down transistor connected to drive said output node toward a more negative supply voltage,
      said pull-up and pull-down transistors being controlled to operate in dependence on the level of the input signal;
   a first saturation-detector circuit, connected to provide a first signal indicative of the degree of saturation of said pull-up transistor, and a second saturation-detector circuit, connected to provide a second signal indicative of the degree of saturation of said pull-down transistor;
   a combining circuit connected to receive said first and second signals, and to provide a combined output which is increased whenever said first or second signals are increased; and
   an automatic gain control circuit connected to reduce the magnitude of said input to said final stage when said combined signal increases;
   an integrating RC network chargeable by said sum current to develop a DC signal, virtually representative of the audio signal level;
   whereby said automatic gain control circuit prevents said transistors from operating under conditions of high distortion.

5. The amplifier circuit of claim 4, wherein said pull-up transistor and said pull-down transistor are bipolar and respective resistors are operatively connected in series with the base terminal of both said pull-up transistor and said pull-down transistor.

6. The amplifier circuit of claim 4, wherein at least one of said pull-up transistor and pull-down transistor is constituted by a composite structure that comprises a pair of complementary transistors connected to virtually compose an equivalent transistor structure.

7. A method for controlling distortion in a telephone-powered speech amplifier, comprising the steps of:
   (a.) providing an amplifier circuit which has an output stage containing a pull-up transistor and a pull-down transistor;
   (b.) detecting a saturation level of said pull-up transistor and said pull-down transistor and outputting a first and second signal indicative of said saturation level of said pull-up transistor and said pull-down transistor respectively;
   (c.) summing said first and said second signal to provide a third signal;
   (d.) reducing the magnitude of an input signal to said output stage of said amplifier circuit when said third signal increases;
   (e.) converting said sum current signal into a DC control signal via an integrating RC circuit, virtually representative of the level of an AC signal amplified by the amplifier.

8. A system for automatically controlling distortion in an amplifier, comprising:
   a gain stage; and
   an output stage having a pair of output power transistors functioning in phase opposition, said output power transistors being functionally connected to said gain stage,
   wherein said system performs the steps of:
      means for detecting saturation of said power transistors and generating a current representative of the state of saturation reached by the respective transistor;
      means for summing said currents to produce a sum current signal;
      means for converting said sum current signal into a DC control signal via an integrating RC circuit, virtually representative of the level of an AC signal amplified by the amplifier, wherein said DC control signal is used for modifying the gain of said gain stage.

9. An automatic distortion control system as defined in claim 8, wherein said means for converting said sum current signal into said DC control signal is effected by charging, with said sum current signal, an integrating RC network.

10. An automatic distortion control system as defined in claim 8, wherein the detection of the state of saturation of the transistors of said output pair of transistors of the amplifier is implemented by sensing the voltage difference between collector and base of each transistor of said pair.

11. An automatic distortion control system as defined in claim 10, wherein the base-collector voltage of each transistor of said output pair of transistor is sensed by a bias current generating transistor having an emitter connected to the collector of the transistor of said output pair of transistors and a base connected to a driving node of the base of said output pair of transistors.

12. An automatic distortion control system as defined in claim 8, wherein at least one of said transistors of said output pair functioning in phase opposition is constituted by a composite structure that comprises a pair of complementary transistors connected as to virtually compose an equivalent transistor structure.

13. An automatic distortion control system as defined in claim 8, wherein a amplifier is an audio amplifier of a telephone that is powered through the telephone line.

14. A speech amplifier for a telephone powered through the telephone line, comprising a gain stage and an output stage formed by a pair of bipolar power transistors functioning in phase opposition, an automatic gain control loop (AGC) including means for generating a DC signal representative of the level of an audio signal amplified by the amplifier, means for comparing said DC signal with a reference signal and for generating an automatic gain control signal that is used for modifying the gain of said gain stage of the amplifier, wherein said means for generating said DC signal comprise
   a saturation sensing bipolar transistor having an emitter connected to the collector of a respective one of said pair of power transistors, a base functionally connected to the base of the same power transistor and a collector functionally connected to a supply node of the output stage through a first branch of a current mirror circuit;
   means for summing the currents generated by said sensing transistors;
   an integrating RC network chargeable by said sum current to develop said DC signal, virtually representative of the level of said audio signal.

15. A line-powered telephone including an audio amplifier for implementing line monitoring and amplified listening functions, and comprising a gain stage, an output push-pull stage and an automatic AGC loop including means for generating a DC signal representative of the level of an audio signal comprising a saturation sensing bipolar transistor having an emitter connected to the collector of a respective bipolar power transistor, a base functionally connected to the base of the same power transistor and a collector functionally connected to a supply node of the output stage through a first branch of a current mirror circuit;

means for summing the currents generated by said sensing transistors;

an integrating RC network chargeable by said sum current to develop a DC signal, virtually representative of the audio signal level.

* * * * *

UNITED STATES PATENT AND TRADEMARK OFFICE
CERTIFICATE OF CORRECTION

PATENT NO. : 5,734,287
DATED : March 31, 1998
INVENTOR(S) : Consiglio, et al

It is certified that error appears in the above-identified patent and that said Letters Patent is hereby corrected as shown below:

On the title page, item

[75] Inventors:    Strike:
                         "Inferiore"

Insert:
                         -- Venegono Inferiore --

In the Drawings:

Figure 3A:    Strike Figure 3A:

Insert:

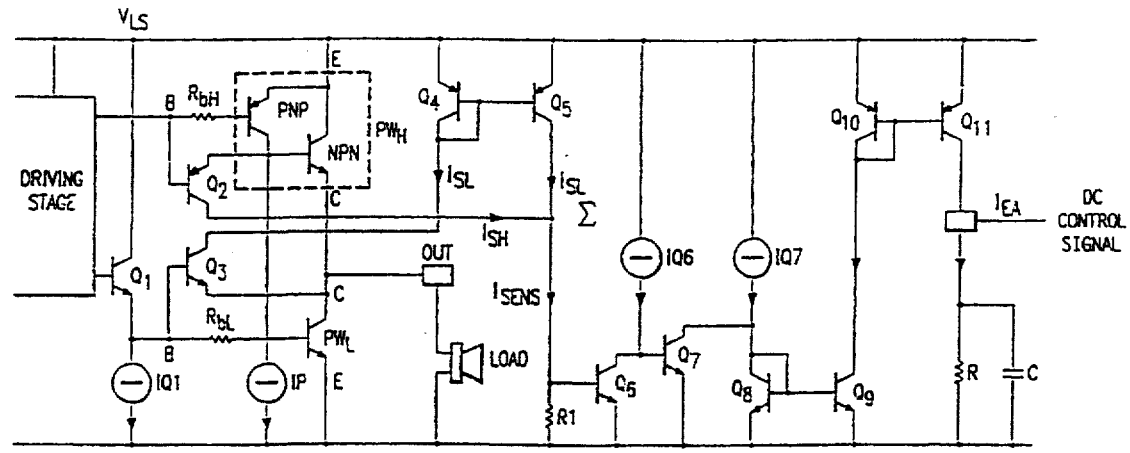

FIG. 3A

UNITED STATES PATENT AND TRADEMARK OFFICE
CERTIFICATE OF CORRECTION

PATENT NO. : 5,734,287
DATED : March 31, 1998
INVENTOR(S) : Consiglio, et al

It is certified that error appears in the above-identified patent and that said Letters Patent is hereby corrected as shown below:

Figure 3B:  Strike Figure 3B:

Insert:

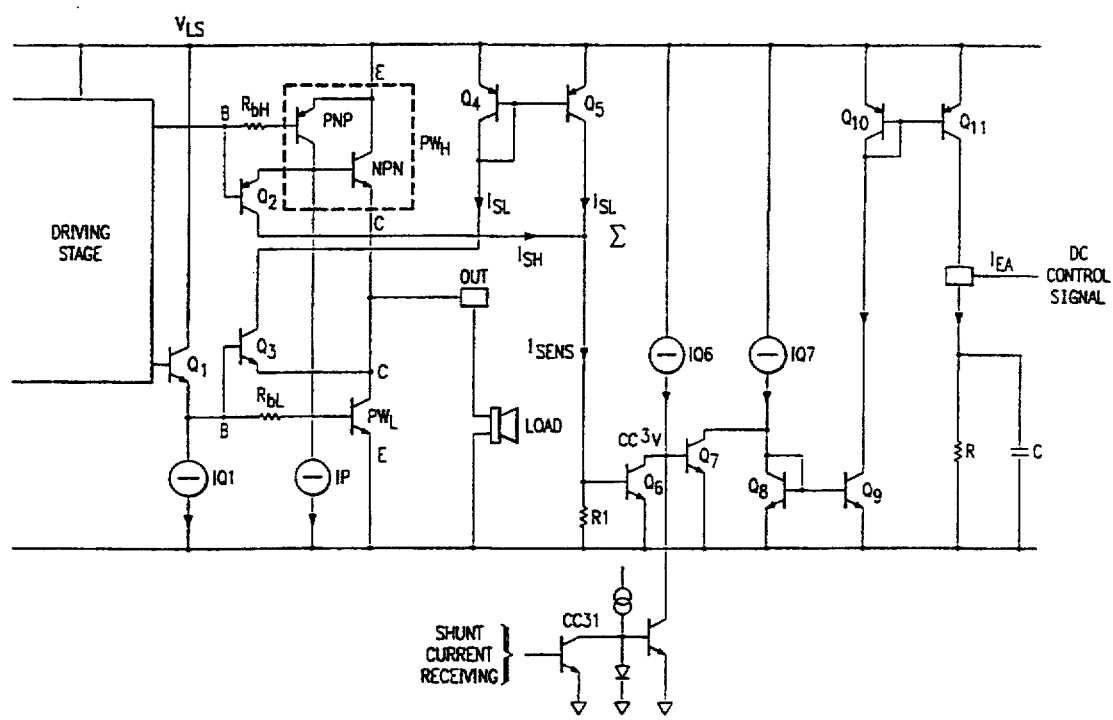

FIG. 3B

UNITED STATES PATENT AND TRADEMARK OFFICE
CERTIFICATE OF CORRECTION

PATENT NO. : 5,734,287
DATED : March 31, 1998
INVENTOR(S) : Consiglio, et al

It is certified that error appears in the above-identified patent and that said Letters Patent is hereby corrected as shown below:

Column 5, Line 3    Strike:

"resistance"

Insert:

-- resistances --

Column 8, Line 30    Strike:

"transistor"

Insert:

-- transistors --

UNITED STATES PATENT AND TRADEMARK OFFICE
CERTIFICATE OF CORRECTION

PATENT NO. : 5,734,287
DATED : March 31, 1998
INVENTOR(S) : Consiglio, et al

It is certified that error appears in the above-identified patent and that said Letters Patent is hereby corrected as shown below:

Column 8, Line 43    Strike:

"the"

Insert:

-- a --

Signed and Sealed this

Thirteenth Day of October 1998

Attest:

BRUCE LEHMAN

Attesting Officer

Commissioner of Patents and Trademarks